US007492185B1

United States Patent
Huang et al.

(10) Patent No.: US 7,492,185 B1
(45) Date of Patent: *Feb. 17, 2009

(54) INNOVATED TECHNIQUE TO REDUCE MEMORY INTERFACE WRITE MODE SSN IN FPGA

(75) Inventors: Joseph Huang, San Jose, CA (US); Chiakang Sung, Milpitas, CA (US); Michael H. M. Chu, Fremont, CA (US); Yan Chong, San Jose, CA (US)

(73) Assignee: Altera Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/956,182

(22) Filed: Dec. 13, 2007

Related U.S. Application Data

(63) Continuation of application No. 11/354,766, filed on Feb. 14, 2006, now Pat. No. 7,330,051.

(51) Int. Cl.
H03K 19/173 (2006.01)
(52) U.S. Cl. .................................. 326/38; 326/41
(58) Field of Classification Search ............. 326/37–41, 326/93–98, 26, 27
See application file for complete search history.

(56) References Cited

U.S. PATENT DOCUMENTS

| 6,034,541 | A | 3/2000 | Kopec et al. |
| 6,661,254 | B1 | 12/2003 | Agrawal et al. |
| 6,971,040 | B2* | 11/2005 | Volk ........................... 713/401 |
| 2004/0003194 | A1* | 1/2004 | Bodas et al. ................ 711/167 |
| 2006/0256877 | A1* | 11/2006 | Szczepanek et al. ........ 375/246 |
| 2008/0065820 | A1* | 3/2008 | Gillingham et al. ......... 711/105 |

* cited by examiner

*Primary Examiner*—Don P Le
(74) *Attorney, Agent, or Firm*—Townsend and Townsend and Crew LLP

(57) ABSTRACT

The amount of simultaneous switching noise generated through the operation of a programmable device can be reduced by reducing the number of pins switching at the same time. An I/O bank can include a number of I/O pin subsets, or DQS groups, each programmed to switch at a different time so that the switching times of the various pins can be staggered for each system clock cycle. Programmable delay elements can be used to control the delay of each subset. The programmable elements can be placed between the system clock and the output registers in order to delay the receiving of the clock signal by the registers and therefore delaying the switching of the output buffers. The programmable delay elements also can be placed between the output registers and the output buffers in order to delay the receiving of the output data by, and subsequent switching of, the output buffers.

21 Claims, 7 Drawing Sheets

INNOVATED TECHNIQUE TO REDUCE MEMORY INTERFACE WRITE MODE SSN IN FPGA

CROSS-REFERENCES TO RELATED APPLICATIONS

This application is a continuation of U.S. patent application Ser. No. 11/354,766, filed on Feb. 14, 2006, which is hereby incorporated herein by reference in its entirety for all purposes.

BACKGROUND

The present invention relates to the field of programmable devices, and systems and methods for programming the same. Programmable devices, such as field programmable gate arrays (FPGAs), typically include thousands of programmable logic cells that use combinations of logic gates and/or look-up tables to perform logic operations. Programmable devices typically also include a number of functional blocks having specialized logic devices adapted to specific logic operations, such as adders, multiply and accumulate circuits, phase-locked loops, and one or more embedded memory array blocks. The logic cells and functional blocks typically are interconnected with a configurable switching circuit, which selectively routes connections between the logic cells and functional blocks. By configuring the combination of logic cells, functional blocks, and the switching circuit, a programmable device can be adapted to perform virtually any type of information processing function.

Programmable devices typically include one or more input/output (I/O) banks for communication with external devices, such as memory devices, network interfaces, data buses and data bus controllers, microprocessors, other programmable devices, application-specific integrated circuits (ASICs), or virtually any other type of electronic device. Each I/O bank is connected with a number of conductive I/O pins, balls, or other electrical connectors in the programmable device chip package. An I/O bank includes logic for sending and receiving data signals, control signals, clock signals, power and ground signals, or any other type of signal used in conjunction with communications between the programmable device and an external device.

The I/O banks of a programmable device typically include logic, amplifiers, filters, and other circuits that together can be configured to provide one or more standard interfaces between the programmable device and external devices. Additionally, the I/O banks of a programmable device can be configured to provide custom or proprietary interfaces if required by a particular application.

Simultaneous switching noise (SSN) is one of the many challenges facing the design and implementation of high speed external interfaces. These interfaces typically involve a large number of pins switching at substantially the same point in time. For example, a DDR-II 72-bit interface between an FPGA and external memory devices can have 72 simultaneously switching bits, which can cause signals such as a ground signal or supply voltage (e.g., Vcc) signal to bounce or sag. If the magnitude of the noise is large enough and/or the duration long enough, the noise can adversely affect the functionality of the programmable device and overall system due to poor signal integrity. This noise problem also generally increases with higher performance requirements.

A prior approach to reducing SSN is to optimize the circuit board supporting the system of programmable devices and/or other devices. For example, designers can use 20 layer circuit boards instead of 10 layer circuit boards to allow for additional ground planes. The additional ground planes help minimize sags or bounces in the various signals, thereby reducing the amount of SSN in the system. This solution is not optimal, however, as the overall cost, manufacture time, and/or complexity of the systems can be substantially increased.

BRIEF SUMMARY

Systems and methods in accordance with various embodiments of the present invention can reduce the amount of simultaneous switching noise through the use of programmable delay elements that can deliberately alter the phases of signals on pins within an I/O bank.

In one embodiment, a programmable device includes a programmable device core and a plurality of I/O banks. A programmable delay element can be used with at least one subset of I/O pins in order to delay the switching of that subset, whereby certain subsets of I/O pins in the programmable device switch at slightly different times within a clock cycle. Each subset can correspond to a DQS group, or a group of pins timed to write data using a specific DQS signal.

In another embodiment, a programmable delay element can be used with each subset of I/O pins in an I/O bank. Each programmable delay element can be programmed to delay the switching of the pins of the respective subset so not every subset switches at substantially the same time for a given clock cycle. At least one of the programmable delay elements can be programmed to not delay the switching of a respective subset.

In one embodiment, a subset can include a programmable delay element for every data pin in the subset, which can include DQS pins and DQ pins, for example. In one embodiment, programmable delay elements are positioned between an output register and an output buffer for each data pin, in order to delay the receiving of the output data signal by the output buffer and hence delay the switching of the output buffer for that data pin.

In another embodiment, an I/O pin subset can include at least one programmable delay element positioned between a system clock pin and the output registers, in order to control the time at which the output registers receive the clock signal and thereby delay the switching of the output buffers.

Other embodiments will be obvious to one of ordinary skill in the art in light of the description and figures contained herein.

BRIEF DESCRIPTION OF THE DRAWINGS

Various embodiments in accordance with the present invention will be described with reference to the drawings, in which.

DETAILED DESCRIPTION

Systems and methods in accordance with various embodiments of the present invention can overcome these and other deficiencies in existing programmable devices by reducing the amount of noise generated, at least in part, by the simultaneous switching of large numbers of pins. Since simultaneous switching noise can be determined using $\Delta v = L(di/dt)$, where $\Delta v$ is the change in voltage, L is the inductance, and di/dt is the change in current over time, the noise can be reduced by controlling variations in current in a programmable device.

Figure 1:
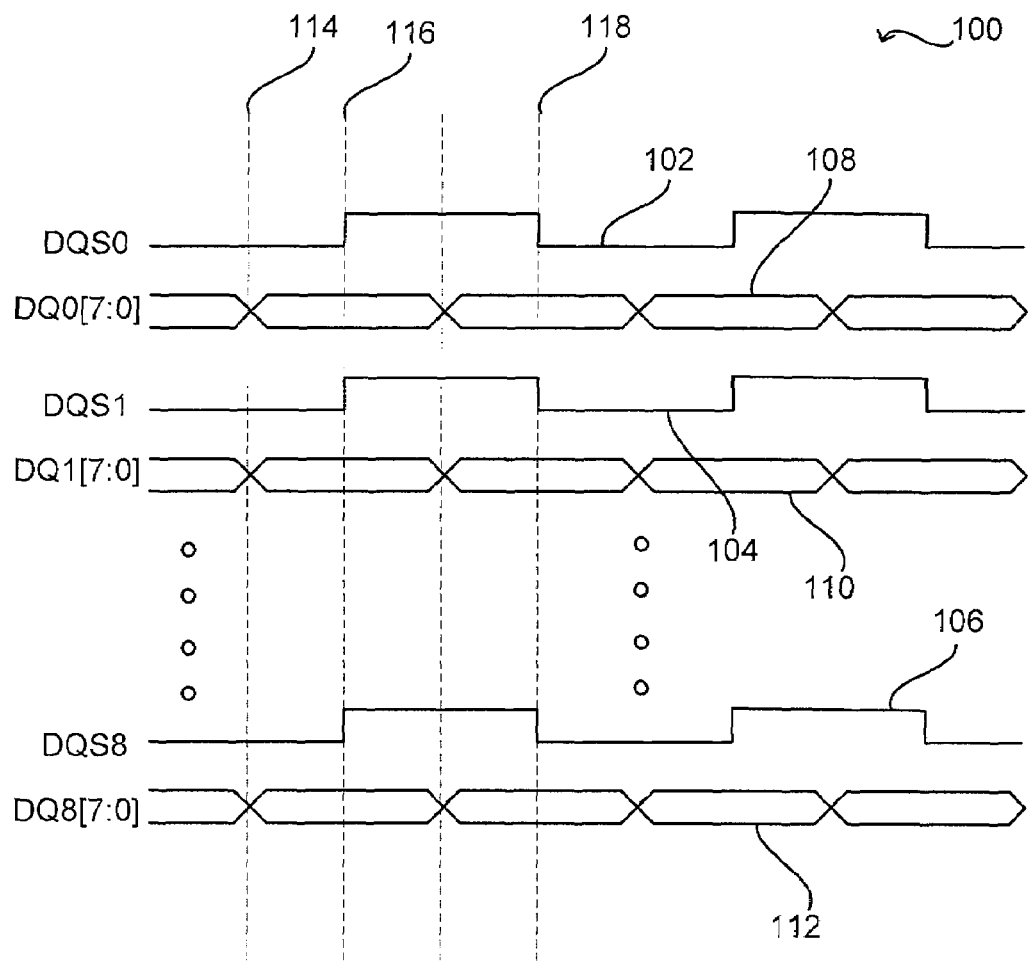
FIG. 1 is a first timing diagram showing switching patterns of an example interface implemented with prior programmable devices.

The relative timing of I/O pins for an example interface implemented in a prior programmable device can be described with respect to the timing diagram 100 of FIG. 1. The I/O pins of a prior I/O bank can be partitioned into a number of subsets, such as nine subsets of I/O pins, each subset outputting a strobe signal (DQ0 through DQ7). For simplicity, only three of these strobe signals (102, 104, 106) are shown, as each DQS signal would appear identical with respect to time in the figure. Each I/O pin subset includes a plurality of data pins, such as the eight pins of DQ0[7:0] that switch at the same time, such as at time 114. For simplicity, only DQ signals 108, 110, 112 corresponding to the three shown DQS signals are displayed, as each DQ signal would appear identical with respect to time in the figure. Having eight pins for each of the nine I/O subsets in this embodiment allows up to 72 pins to switch simultaneously.

As is known for DDR interfaces, the state of each DQ pin can be latched into the registers upon the leading edge of the corresponding DQS signal 102, 104, 106, such as at time 116. The pins can be allowed to switch again per the predetermined switching cycle, then have their values latched again upon the falling edge of the DQS signal (hence the double data rate), such as at time 118. Reading upon the rising and falling edges of the respective DQS signal is well known for a DDR interface and will not be discussed herein in detail.

As discussed above, having a large number of pins switching at the same time can lead to unacceptable amounts of SSN. While it would be desirable to simply reduce the number of simultaneously switching pins, many interface specifications require that the pins switch at substantially the same time. Often, only a small tolerance is provided in the interface specification for timing differences due to factors such as component differences, clock skew, and path length variations. It is possible, however, to vary, stagger, or skew the timing of the switching of the various pins while still remaining within the allowed tolerances of the specification.

Figure 2:
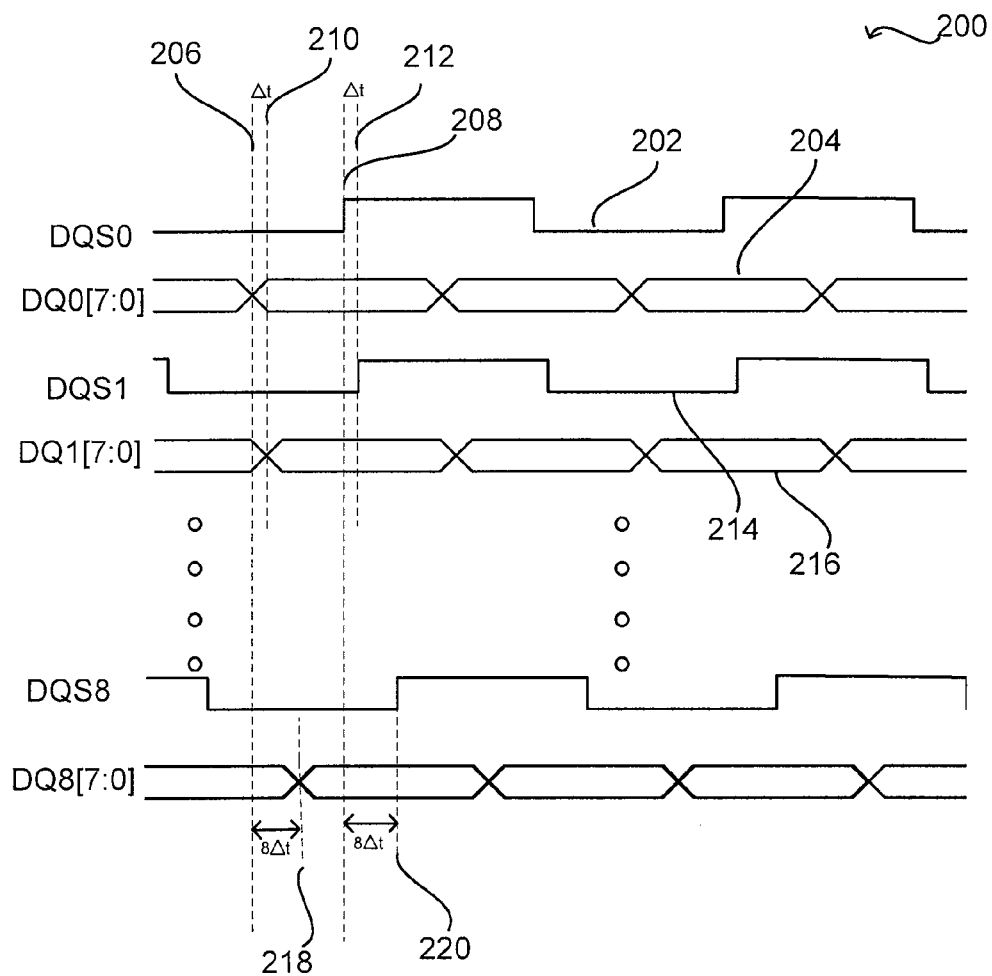
FIG. 2 is a second timing diagram showing staggered switching patterns that can be used with subsets of I/O pin subsets in accordance with an embodiment of the present invention.

For example, consider the example timing diagram 200 of FIG. 2, which shows staggered switching patterns that can be used with subsets of I/O pins in accordance with another embodiment of the present invention. Similar to FIG. 1, this timing diagram shows only strobe (DQS) and data (DQ) signal waveforms for three of the nine I/O pin subsets for this embodiment, with only one waveform shown for the eight DQ signals of each subset. As can be seen in this embodiment, the zeroth subset operates in time similar to the zeroth subset in FIG. 1, as the DQ0 signal 204 can switch at time 206, which is approximately a quarter of the way through the cycle of the DQS0 strobe signal 202. The DQ0 registers can be read upon the rising edge of the DQS0 cycle, which occurs at time 208, or approximately midway between switching points along the DQ0 signal 204. This is similar to the operation for the DQ0 108 and DQS0 102 patterns in FIG. 1.

When looking at the first subset, having corresponding DQS1 214 and DQ1 216 signals, it can be seen that the phase of the signals is shifted with respect to the zeroth subset, such that the timing of the signals for the first subset is delayed by an amount $\Delta t$ with respect to the timing of the zeroth subset. The amount of phase shift for each signal is determined by the amount of timing delay $\Delta t$ with respect to the length in time of a clock cycle. For example, a 0.01 ns $\Delta t$ for a 1.875 ns clock cycle would result in a phase shift of approximately 2°. The DQ and DQS signals for each subset remain 90° out of phase with each other, so that the set-up and hold times are not violated when latching data signals.

In this embodiment, the switching point for the DQ1 signal 216 of the first subset occurs at time 210, which occurs a difference $\Delta t$ in time after the switching point of the DQ0 signal 204 of the zeroth subset, which occurs at time 206. This time difference allows the pins of the first subset to switch at a slightly different time than the pins of the zeroth subset, thereby reducing the number of simultaneously switching pins and hence reducing SSN. The strobe signal DQS1 214 for the first subset also is delayed by an amount $\Delta t$, such that the rising edge of DQS1 occurs at time 212, which is delayed by an amount $\Delta t$ from the switching of signal DQ0 at time 208. By delaying both the DQS1 and DQ1 signals by $\Delta t$, the timing of the rising edge of the DQS1 signal still occurs approximately midway between switching points of the DQ1 signal, such that the data of the first subset is still being latched at the desired time relative to switching times.

The shifting of phase can be repeated for each subset of I/O pins, so that each subset can be delayed by an amount $\Delta t$ with respect to a previous subset. For example, DQS2, which is omitted from FIG. 2 for clarity, can be delayed an amount $\Delta t$ with respect to DQS1, and DQS1 delayed an amount $\Delta t$ with respect to DQS0, such that DQS2 is delayed by an amount $2\Delta t$ with respect to DQS0, and so forth. The switching of the DQ8 signal for the eighth subset at time 218 then is delayed an amount $8\Delta t$ with respect to the switching of DQ0 at time 210, and the rising edge of the DQS8 signal at time 220 is delayed an amount $8\Delta t$ with respect to the rising edge of the DQS0 signal at time 208.

In order to avoid overlap with the switching of the zeroth subset in the next cycle, the period $8\Delta t$ should be less than the half-cycle time of the strobe signal for double data rate interfaces. For a 266 MHz clock signal, for example, the data-bit width for an example DDR interface is about 1.875 ns. As such, $\Delta t$ can at most be about 0.2 ns. In order to ensure system timing, and to stay within interface specification tolerances, $\Delta t$ may have to be substantially less. In one embodiment, each delay step $\Delta t$ is designed to be equivalent to about ½ or ⅓ of the rise time and/or the fall time, depending upon the output buffer design.

By providing for delays between subsets, programmable devices can be tuned during design and tuning in order to minimize SSN while maintaining performance. For example, a programmable device can be tested with no shift ($\Delta t=0$) between various I/O pin subsets. After determining that SSN can or should be reduced, an initial delay step $\Delta t$ can be programmed into the device. The performance and SSN for this delay step can be tested to determine whether the programmable device meets desirable performance criteria. The delay step $\Delta t$ can be increased to further reduce SSN as long as the programmable device still meets timing and other requirements. There will be some maximum $\Delta t$ that can be used for each programmable device to ensure proper timing, and the designers can make a tradeoff as to how close to come to this maximum $\Delta t$ (or how much of a reduction in noise is desired). A balance therefore can be reached between acceptable SSN reduction and device performance.

While a programmable device in accordance with one embodiment can utilize a single adjustable value of $\Delta t$, which can be relatively simple to implement, there also can be different values of $\Delta t$ for different subsets. For example, the noise created upon 16 pins switching might take longer to die off than the noise created upon 8 pins switching, such that a first delay step $\Delta t_1$ might be used after the 16 pin switch that is longer than a second delay step $\Delta t_2$ used after the 8 pin switch, where $\Delta t_1$ is not necessarily an integer multiple of $\Delta t_2$. Once designers and/or testers have determined optimal $\Delta t$ values for a given design, the programmable delay settings can be included in the device configuration.

Figure 3:
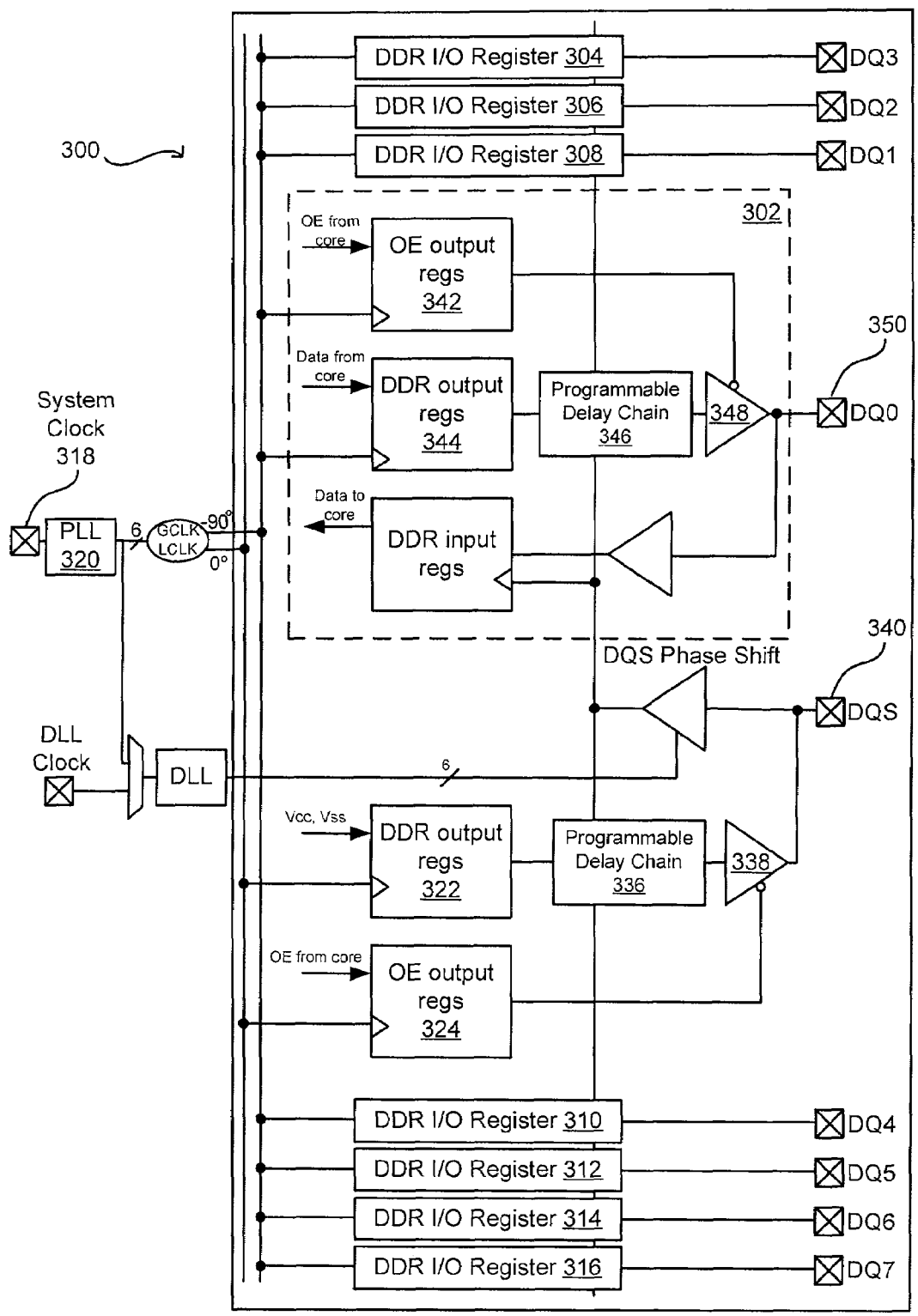
FIG. 3 illustrates an I/O pin subset including programmable delay elements in accordance with an embodiment of the present invention.

FIG. 3 is a diagram showing an exemplary I/O pin subset 300, or DQS group, including programmable delay elements in accordance with one embodiment of the present invention. The programmable delay elements can be used to implement delay steps such as those discussed above with respect to FIG. 2. This I/O pin subset 300 is shown to contain eight I/O registers 302, 304, 306, 308, 310, 312, 314, 316, which in this embodiment are double data rate (DDR) I/O registers, although single rate and other I/O registers can be used in accordance with the various embodiments described herein. For simplicity, only the internal registers and components of I/O register 302 are shown, although similar elements can be contained within each other I/O register. For further simplicity, since SSN is primarily problematic for write operations, only write/output operations of the registers will be described. Read operations and processes therefore are well known in the art and do not need to be described for an understanding of the various embodiments. Aspects of the various embodiments can apply to read and/or write operations for various applications.

As shown in the figure, the I/O pin subset 300 receives a system clock signal at a system clock pin 318, as double data rate static memory typically is tied to the front-side bus clock of the system. This system clock signal can be used to generate timing signals for both the DQ and DQS signals. As discussed above, it may be necessary for the DQ or DQS signals to be out of phase (or otherwise altered) in order to properly latch the data. In order to read data near the middle of a switching cycle, to avoid reading at or near a switching point, a shift of +/−90° typically is made to the DQ or DQS signals. A phase lock loop 320 and any other appropriate elements can be used to generate a global clock (GCLK) signal and a local clock (LCLK) signal, with a GLCK line going to the DQS pin and a LCLK line going to the DQ pins. In this embodiment the GLCK signal is not phase shifted (0° phase shift) and the LCLK signal is phase shifted by −90°.

The GLCK (0°) signal is directed to the DQS output registers, including a DDR output register 322, which also can receive supply voltages Vcc, Vss, and an output enable (OE) register 324, which can receive an OE signal from the programmable core. When the output is enabled, the DDR output register 322 can generate a regulated DQS strobe signal. A programmable delay element 336, here a programmable delay chain, is inserted between the DQS DDR output register 322 and a tri-state output buffer 338. Even though the output enable signal will reach the tri-state DQS output buffer 312 at the same time for each I/O pin subset, the actual strobe signal output from a given subset will be delayed by some selected amount determined by the respective DQS programmable delay chain 336. That is, the programmable delay chain after each DDR register can be used to control the switching timing of the respective output buffer. In this embodiment, the delay programmed into the DQS delay chain 336 can control the switching time of the DQS output buffer 338, which controls the timing of the DQS signal that is output from the DQS pin 340.

The LCLK (−90°) signal can be directed to each of the plurality of DQ DDR I/O registers 302, 304, 306, 308, 310, 312, 314, 316. For simplicity, the use of the signal will be described with respect to DQ0 I/O register 302, although the signal is received substantially simultaneously and can be used similarly by each other DQ I/O register. The LCLK signal can be received by an OE output register 342 and a DDR output register 344 for each I/O register, such that when the output is enabled and the device is in write (output) mode, the data bit can be passed from the DQ DDR output register 344.

A programmable delay chain 346 also can be inserted between the DQ DDR output register 344 and the corresponding DQ output buffer 348 for each DQ pin 350 (DQ0 through DQ7 in this example) in a subset. In this way, each DQ signal in a subset still can be 90° out of phase with respect to the corresponding DQS signal, but the switching time of the DQ output buffers can be different than the switching time of the DQ output buffers in other subsets of the programmable device. As discussed with respect to FIG. 2, for example, the switching times of the various subsets can be staggered by integer multiples of the programmed delay time $\Delta t$. In this embodiment the pins of each subset switch at a different time, although in other embodiments some subsets can be allowed to switch at the same time (such as an eight-subset device having two subsets switching at each of four different times).

Figure 4:
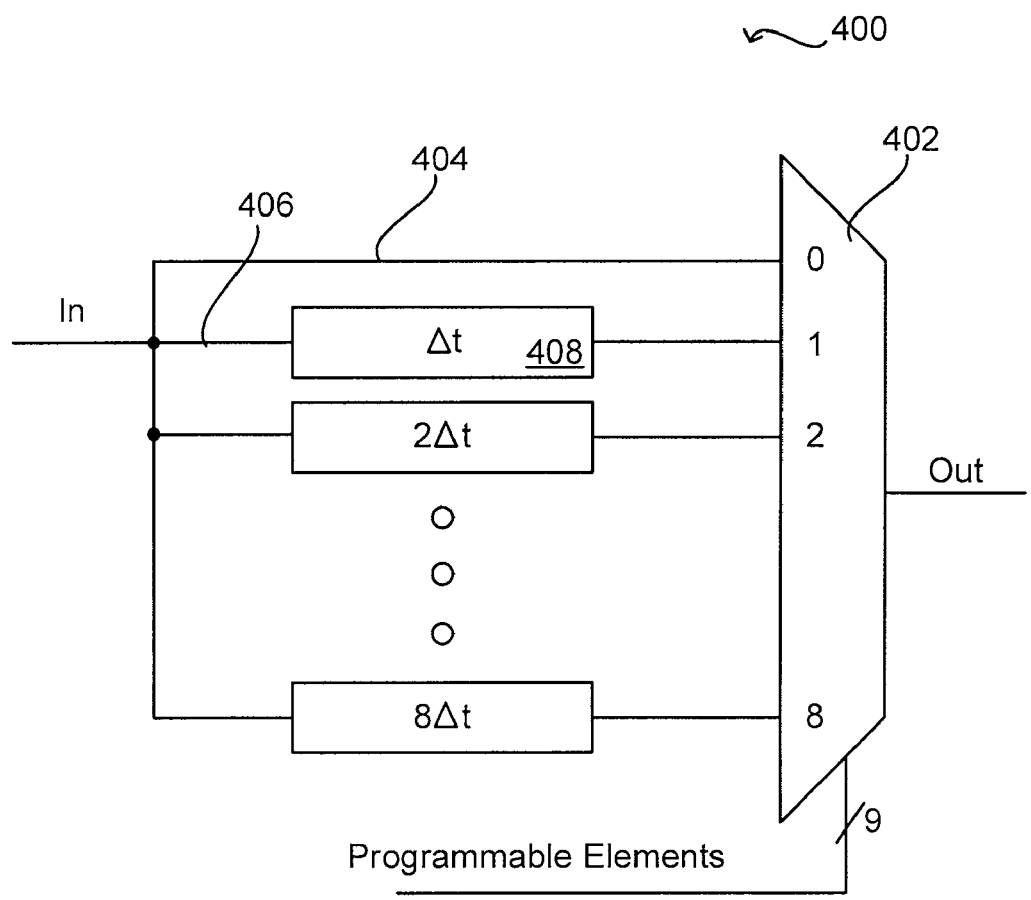
FIG. 4 illustrates details of an I/O pin subset in accordance with an embodiment of the present invention.

FIG. 4 shows an exemplary programmable delay chain 400 that can be used with the I/O pin subset of FIG. 3. This delay chain 400 is based around a simple multiplexer 402 as known in the art. This multiplexer is shown to include nine different paths, one path for each subset of the exemplary I/O bank. It should be understood that other numbers of paths and correspondence with numbers of subsets can vary by embodiment. For a given subset, each programmable delay chain in that subset can be programmed to select one of the nine paths, such that the timing of each of the registers in that subset is consistent. For example, delay chains in the zeroth subset might be programmed to select a zeroth path 404, which does not contain any delay elements, such that the timing of the DQ0 and DQS0 signals is not delayed. A first subset might be programmed such that each delay chain in that subset uses a first path 406, which includes a delay element 408 that can delay the respective signal by an amount $\Delta t$. This delay element can include any appropriate delay element(s) known or used in the art for delaying signals, such as an inverter and loading transistor or logic gate. A second subset can select a second path, which can have a second delay element (or elements) delaying the signal by an amount $2\Delta t$. It should be understood that the second path could simply include double the elements used in the first path to delay by an amount $\Delta t$, or could use any other appropriate combination of elements. An alternative embodiment could use soft logic to control and allow for programming of the delays.

Figure 5:
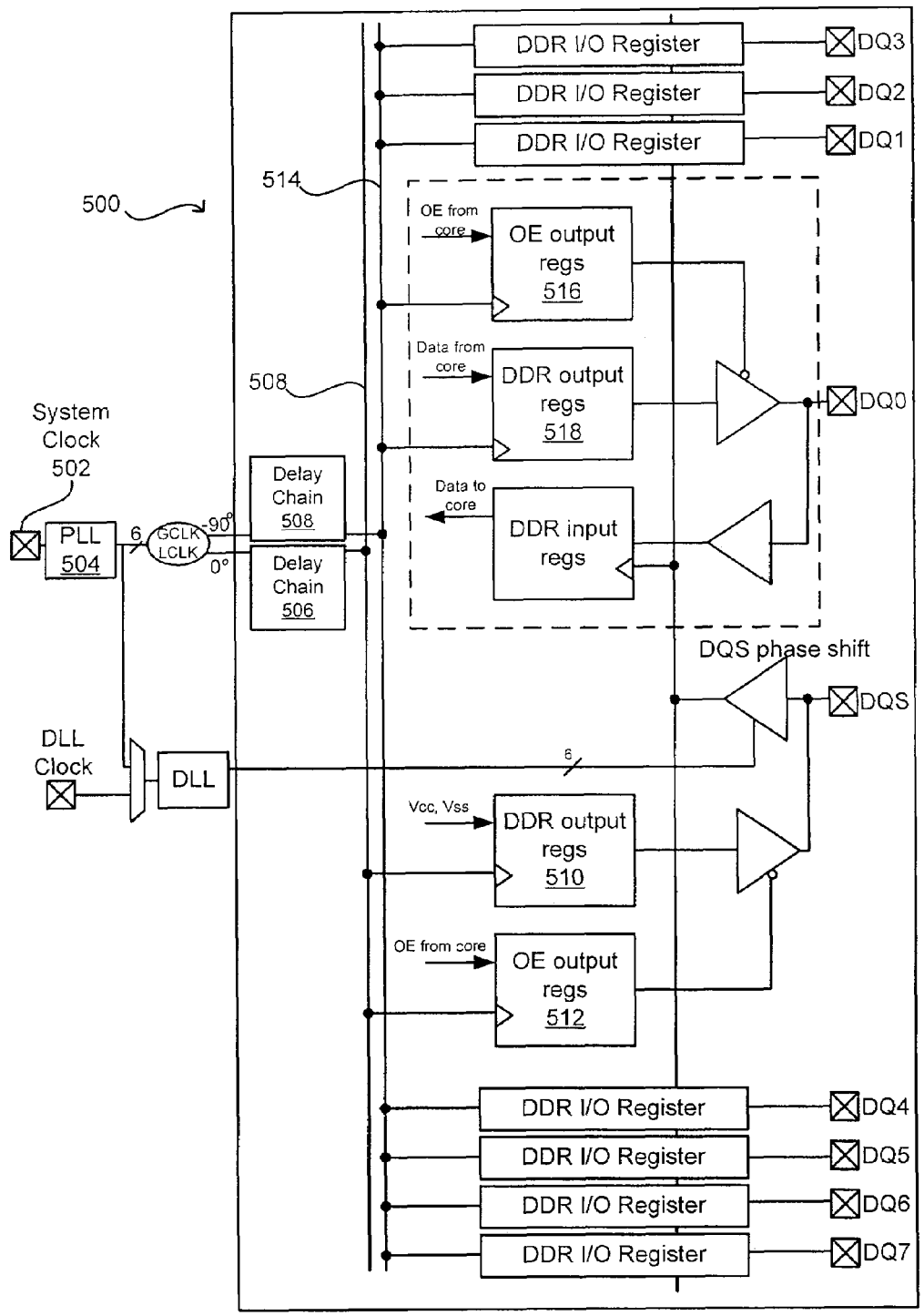
FIG. 5 illustrates an I/O pin subset including programmable delay elements in accordance with another embodiment of the present invention.

Another approach to implementing staggered delays for each subset will now be described with respect to FIG. 5, which shows another I/O pin subset 500 including programmable delay elements in accordance with one embodiment of the present invention. In this embodiment, programmable delay chains 506, 508 are placed in the clock path, controlling clock timing in a sequential manner for each DQS group. Whereas the embodiment of FIG. 3 delays the data signal arriving at the output buffers from the respective registers, with each register receiving the same initial clock signal, this embodiment delays the clock signals directed to each register, such that the signal time between each register and a corresponding pin remains substantially constant (but is shifted in time between the various subsets).

Each subset can receive the same system clock signal through a system clock pin 502, as described above. In this embodiment, however, programmable delay chains are used on the GLCK and LCLK signals after the phase lock loop 504 but before those signals reach the individual registers. For example, a first programmable delay chain 506 can be positioned along the GCLK (0°) clock signal between the phase lock loop 504 and the line 508 directing the signal to the DQS DDR output register 510 and DQS OE output register 512. Similarly, there can be a programmable delay chain 508 positioned along the LCLK signal between the PLL 506 and the line 514 directing the clock to each DQ DDR output register 518 and each DQ OE output register 516. This approach can be desirable for some applications, as there are fewer elements used for each subset (two delay chains vs. nine for the embodiment of FIG. 3). The approach of FIG. 3 may be more desirable for other applications, as the placement of the delay chains and associated elements can allow for other types of control over the respective output buffers. The delay chains used in the embodiment of FIG. 5 can be similar to those used in the embodiment of FIG. 3.

In another embodiment, a single programmable delay element or programmable delay chain can be used between the system clock pin and the phase shifting element(s) of each subset, in order to adjust the timing of the clock signal for each subset.

Figure 6:
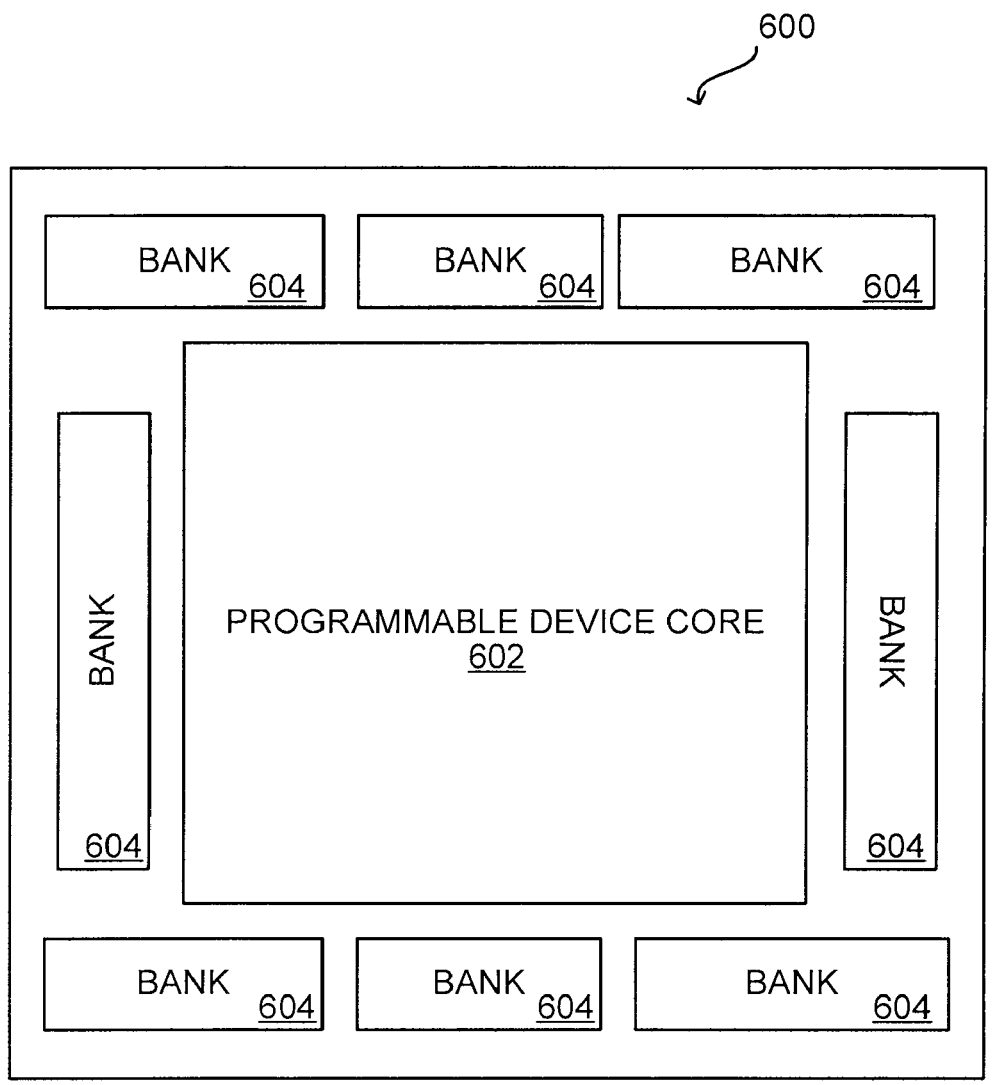
FIG. 6 is a diagram of a programmable device and I/O bank architecture that can be used in accordance with one embodiment of the invention.

FIG. 6 illustrates an exemplary I/O bank architecture 600 for a programmable device that can take advantage of the I/O pin subsets described above. This architecture 600 includes a programmable device core 602, which can include programmable device components such as logic cells, functional blocks, memory units, and a configurable switching circuit as known in the art. This device architecture 600 also includes a plurality of I/O banks 604. Such an architecture can allow for any number of I/O banks, of the same or different size, containing any appropriate number of I/O pins. The number of I/O pins for each I/O bank can be specified, for example, based on the common interface types to be implemented by the I/O banks. If necessary, two or more I/O banks can be aggregated to implement a single interface.

Figure 7:
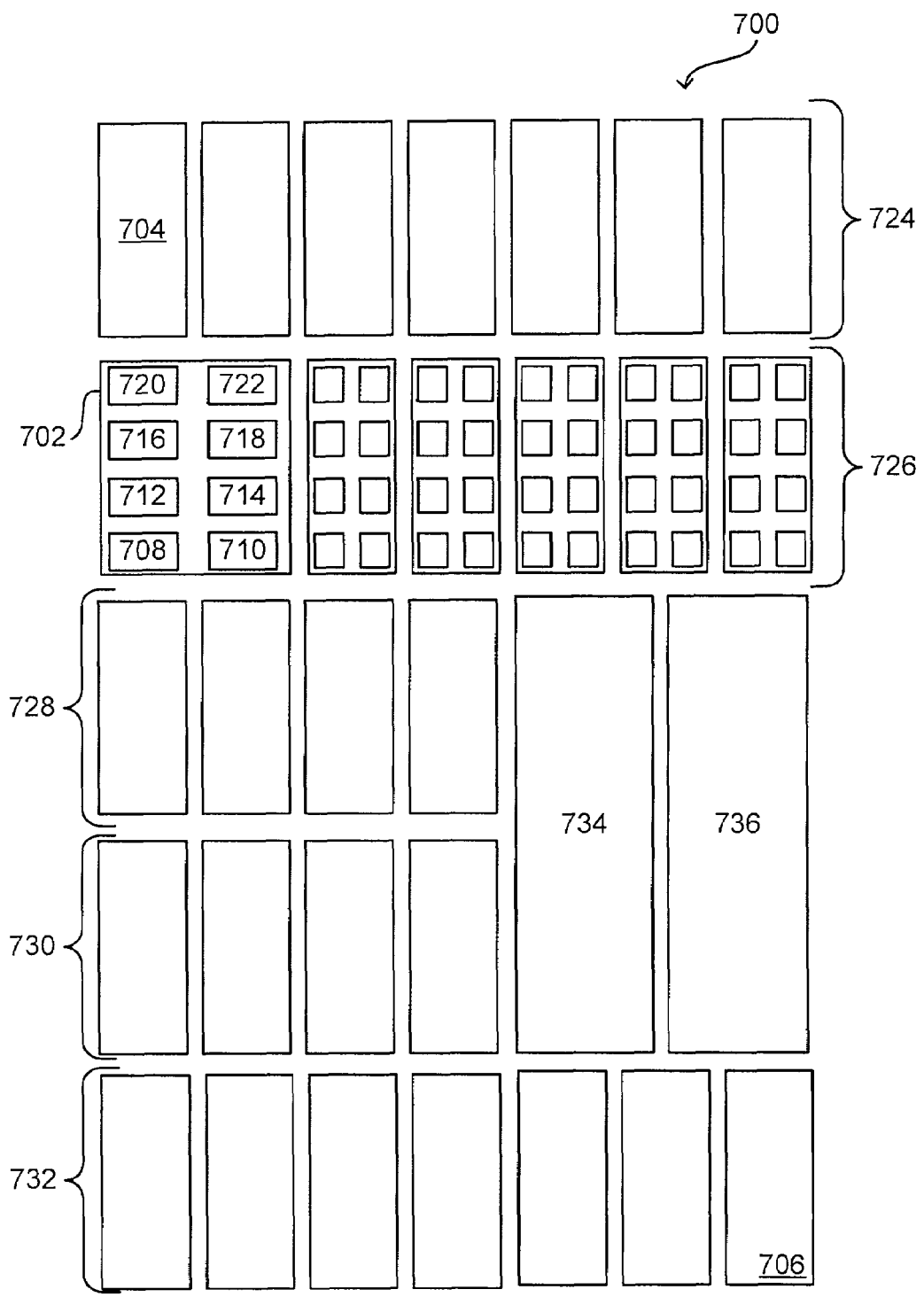
FIG. 7 is a diagram of a programmable device core that can be used in accordance with one embodiment of the invention.

An exemplary programmable device core that can take advantage of the architecture of FIG. 6 is illustrated in FIG. 7. This exemplary programmable device 700 includes a number of logic array blocks (LABs) 702, 704, 706. Each LAB includes a number of programmable logic cells using logic gates and/or look-up tables to perform logic operations, as well as registers to store and retrieve data. LAB 702 illustrates in detail various logic cells 708, 710, 712, 714, 716, 718, 720, and 722. Logic cells are omitted from other LABs in FIG. 7 for clarity. The LABs of this device 700 are arranged into rows 724, 726, 728, 730, and 732. The arrangement of logic cells within a LAB, and of LABs within the various rows, can provide a hierarchical system of configurable connections of the programmable switching circuit.

In addition to logic cells arranged in LABs, this programmable device 700 also can include specialized functional blocks, such as a multiply and accumulate (MAC) block 734 and a random access memory (RAM) block 736. The configuration of the programmable device can be specified at least in part by configuration data stored in configuration memory (not shown). The configuration data can include values for lookup tables defining, for example: the functions of logic cells; values of control signals for multiplexers and other switching devices used by the configurable switching circuit to route signals between inputs, outputs, logic cells, and functional blocks; and/or values specifying other aspects of the configuration of the programmable device, such as modes of operation of the programmable device and its assorted functional blocks and logic cells. The configuration memory can be a monolithic unit, or can be scattered across the programmable device. In these types of programmable devices, portions of the configuration memory can reside within the logic cells, functional blocks, and configurable switching circuit of the programmable device.

For clarity, the portion of the programmable device 700 shown in FIG. 7 only includes a small number of logic cells, LABs, and functional blocks. Typical programmable devices can include thousands, tens of thousands, or more of these elements.

Further embodiments can be envisioned to one of ordinary skill in the art after reading the disclosure herein. For example, although the invention has been discussed with reference to FPGAs and programmable devices, it is equally applicable to standard or structured ASICs, gate arrays, and general digital logic devices. In other embodiments, combinations or sub-combinations of the above disclosed embodiments can be advantageously made. The block diagrams of the architecture are grouped for ease of understanding. However it should be understood that combinations of blocks, additions of new blocks, re-arrangement of blocks, and the like are contemplated in alternative embodiments of the present invention.

While the embodiments are described with respect to the DDR-II standard, advantages of the various embodiments can be used with DDR-III or any other appropriate memory interfaces. Further, although the embodiments are described with respect to 8-bit bases, 9-bit or other bases could be used as well. Embodiments also can be used with other wide interface applications, such as PCI and PCI Express.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. An integrated circuit device, comprising:
a first subset of data pins in an I/O bank;
a second subset of data pins in the I/O bank; and
a programmable delay chain with paths and circuitry adapted to execute a selection of one of the paths,
wherein each of the first and second subsets of data pins includes a clock pin for receiving a system clock signal,
wherein a delay by the programmable delay chain is determined by the selection, and
wherein switching by the first and second subsets of data pins is offset by the delay.

2. An integrated circuit device according to claim 1, wherein:
each data pin has an output register and an output buffer associated therewith for providing output data.

3. An integrated circuit device according to claim 1, wherein:
a difference in time between a switching of the second subset of data pins and a switching of the first subset of pins is programmable.

4. An integrated circuit device according to claim 1, wherein:

a switching time of the second subset of pins relative to the first subset of pins is set to reduce simultaneous switching noise while meeting timing requirements of the integrated circuit device.

5. An integrated circuit device, comprising:
a first subset of data pins in an I/O bank;
a second subset of data pins in the I/O bank; and
a programmable delay chain with paths and circuitry adapted to execute a selection of one of the paths,
wherein a delay by the programmable delay chain is determined by the selection,
wherein switching by the first and second subsets of data pins is offset by the delay,
wherein each data pin has an output register and an output buffer associated therewith for providing output data and
wherein each data pin of the second subset further has a programmable delay element positioned along a path between the output register and the output buffer to delay the switching of each output buffer in the second subset.

6. An integrated circuit device, comprising:
a first subset of data pins in an I/O bank;
a second subset of data pins in the I/O bank, the second subset including a clock pin that receives a clock signal;
an output register for outputting data from the second subset of data pins, the output register being clocked by the clock signal; and
a programmable delay element positioned between the clock pin and the output register to delay transmission of the clock signal from the second subset of data pins to the output register.

7. An integrated circuit device according to claim 6, wherein:
a switching time of the second subset of pins relative to the first subset of pins is set to reduce simultaneous switching noise while meeting timing requirements of the integrated circuit device.

8. An integrated circuit device, comprising:
a first subset of data pins in an I/O bank;
a second subset of data pins in the I/O bank; and
a programmable delay element to offset switching by the first and second subsets of data pins, wherein the data pins for each subset include a DQS strobe pin and at least one DQ data pin, a clock signal for the DQS strobe pin having a different phase than a clock signal for the at least one DQ data pin.

9. An integrated circuit device according to claim 8, wherein:
a switching time of the second subset of pins relative to the first subset of pins is set to reduce simultaneous switching noise while meeting timing requirements of the integrated circuit device.

10. An integrated circuit device, comprising:
an I/O bank including a plurality of I/O pin subsets each comprising a set of pins including data pins and support pins, each I/O pin subset having at least one programmable delay element associated with the data pins such that the data pins of each I/O pin subset switch at a different time as determined by the respective programmable delay element, wherein each programmable delay element includes a programmable delay chain including a plurality of paths and logic adapted to select at least one path, the delay of each programmable delay element being determined by the selection.

11. An integrated circuit device according to claim 10, wherein:
the support pins of each I/O pin subset include a clock pin to receive a system clock signal.

12. An integrated circuit device according to claim 10, wherein:
each data pin has an output register associated therewith for providing output data.

13. An integrated circuit device according to claim 12, wherein:
the at least one programmable delay element of each I/O pin subset is positioned along a path between the clock pin and the output register associated with each data pin.

14. An integrated circuit device according to claim 13, wherein:
the programmable delay element is operable to delay the receiving of the system clock signal by the output registers of each I/O pin subset.

15. An integrated circuit device according to claim 14, wherein:
at least one of the programmable delay elements is programmed not to delay the receiving of the system clock by the output registers of the respective I/O pin subset.

16. An integrated circuit device according to claim 10, wherein:
each data pin has an output register and an output buffer associated therewith for providing output data.

17. An integrated circuit device according to claim 16, wherein:
each data pin further has a programmable delay element positioned along a path between the respective output register and output buffer to control the timing of the switching of the output buffers in each I/O pin subset.

18. An integrated circuit device according to claim 10, wherein:
the data pins for each I/O pin subset include a DQS strobe pin and at least one DQ data pin.

19. An integrated circuit device according to claim 10, wherein:
a clock signal for the DQS strobe pin has a different phase than a clock signal for the at least one DQ data pin.

20. An integrated circuit device, comprising:
a first subset of data pins in an I/O bank;
a second subset of data pins in the I/O bank; and
a programmable delay chain with paths and circuitry adapted to execute a selection of one of the paths,
wherein a delay by the programmable delay chain is determined by the selection, the delay being applied to a strobe signal and a data signal for each of the first and second subsets, and
wherein switching by the first and second subsets of data pins and latching of data for the first and second subsets are each offset by the determined delay.

21. An integrated circuit device, comprising:
a first subset of data pins in an I/O bank;
a second subset of data pins in the I/O bank; and
a programmable delay chain with paths and circuitry adapted to execute a selection of one of the paths,
wherein a delay by the programmable delay chain is determined by the selection, the delay for each of the paths corresponding to less than a half cycle time of a strobe signal for each of the first and second subsets, and
wherein switching by the first and second subsets of data pins is offset by the delay.

* * * * *

UNITED STATES PATENT AND TRADEMARK OFFICE
CERTIFICATE OF CORRECTION

PATENT NO. : 7,492,185 B1  Page 1 of 1
APPLICATION NO. : 11/956182
DATED : February 17, 2009
INVENTOR(S) : Huang et al.

It is certified that error appears in the above-identified patent and that said Letters Patent is hereby corrected as shown below:

On the Title Page
Please correct the citizenship of inventor Chong, Item (75), as indicated below:
Yan Chong, San Jose, CA (CN)

Please correct the city of Assignee, Item (73), as indicated below:
Altera Corporation, San Jose, CA (US)

In claim 5, column 9, line 15, please insert a --,-- after the word "data."

Signed and Sealed this

Seventh Day of September, 2010

David J. Kappos
*Director of the United States Patent and Trademark Office*